United States Patent
Yang et al.

(10) Patent No.: US 7,772,119 B2
(45) Date of Patent: Aug. 10, 2010

(54) DUAL LINER CAPPING LAYER INTERCONNECT STRUCTURE

(75) Inventors: Chih-Chao Yang, Glenmont, NY (US); Haining Yang, Wappingers Falls, NY (US); Keith Kwong Hon Wong, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 22 days.

(21) Appl. No.: 12/186,923

(22) Filed: Aug. 6, 2008

(65) Prior Publication Data

US 2008/0293257 A1 Nov. 27, 2008

Related U.S. Application Data

(62) Division of application No. 11/564,314, filed on Nov. 29, 2006, now Pat. No. 7,576,003.

(51) Int. Cl.
*H01L 21/768* (2006.01)

(52) U.S. Cl. .............. 438/675; 438/927; 257/E21.584; 257/E21.585

(58) Field of Classification Search ............... 438/627, 438/643, 653, 675, 927; 257/E21.584, E21.585
See application file for complete search history.

(56) References Cited

U.S. PATENT DOCUMENTS

| | | |
|---|---|---|
| 3,895,156 A | 7/1975 | Hammond |
| 4,062,720 A | 12/1977 | Alcorn et al. |
| 5,585,673 A | 12/1996 | Joshi et al. |
| 5,695,810 A | 12/1997 | Dubin et al. |
| 6,303,505 B1 | 10/2001 | Ngo et al. |
| 6,319,819 B1 | 11/2001 | Besser et al. |
| 6,323,554 B1 | 11/2001 | Joshi et al. |
| 6,342,733 B1 | 1/2002 | Hu et al. |
| 6,383,925 B1 | 5/2002 | Ngo et al. |
| 6,429,128 B1 | 8/2002 | Besser et al. |
| 6,506,677 B1 | 1/2003 | Avanzino et al. |
| 6,750,541 B2 | 6/2004 | Ohtsuka et al. |
| 6,764,951 B1 | 7/2004 | van Ngo |
| 6,797,652 B1 | 9/2004 | Ngo et al. |
| 6,818,557 B1 | 11/2004 | Ngo et al. |
| 7,138,332 B2 | 11/2006 | Goundar |
| 2004/0130030 A1 | 7/2004 | Kunimune et al. |
| 2004/0192032 A1* | 9/2004 | Ohmori et al. .............. 438/655 |
| 2005/0282404 A1 | 12/2005 | Nguyen et al. |
| 2006/0030143 A1 | 2/2006 | Ivanov |
| 2006/0046502 A1 | 3/2006 | Ngo et al |
| 2006/0172527 A1 | 8/2006 | Marxsen et al. |
| 2007/0123044 A1 | 5/2007 | Hohage et al. |

* cited by examiner

*Primary Examiner*—Minh-Loan T Tran
*Assistant Examiner*—W. Wendy Kuo
(74) *Attorney, Agent, or Firm*—Ian D MacKinnon

(57) ABSTRACT

A high tensile stress capping layer on Cu interconnects in order to reduce Cu transport and atomic voiding at the Cu/dielectric interface. The high tensile dielectric film is formed by depositing multiple layers of a thin dielectric material, each layer being under approximately 50 angstroms in thickness. Each dielectric layer is plasma treated prior to depositing each succeeding dielectric layer such that the dielectric cap has an internal tensile stress.

5 Claims, 12 Drawing Sheets

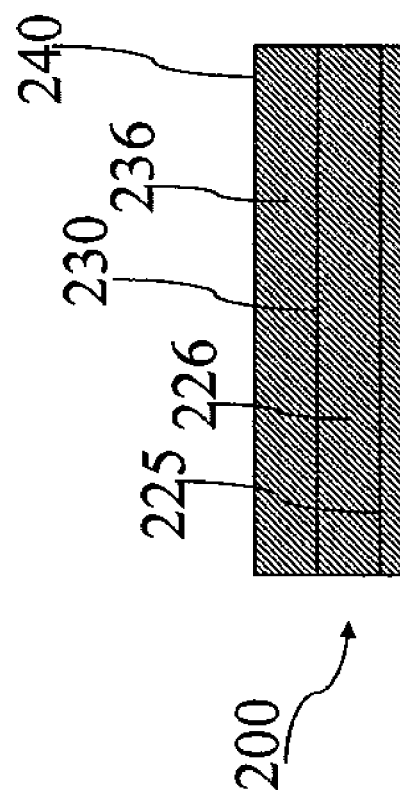
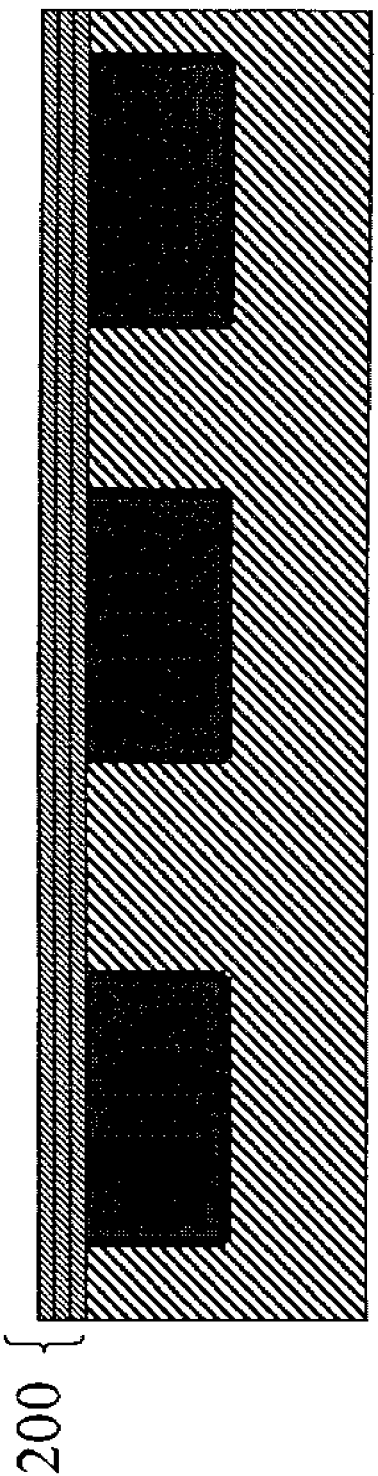

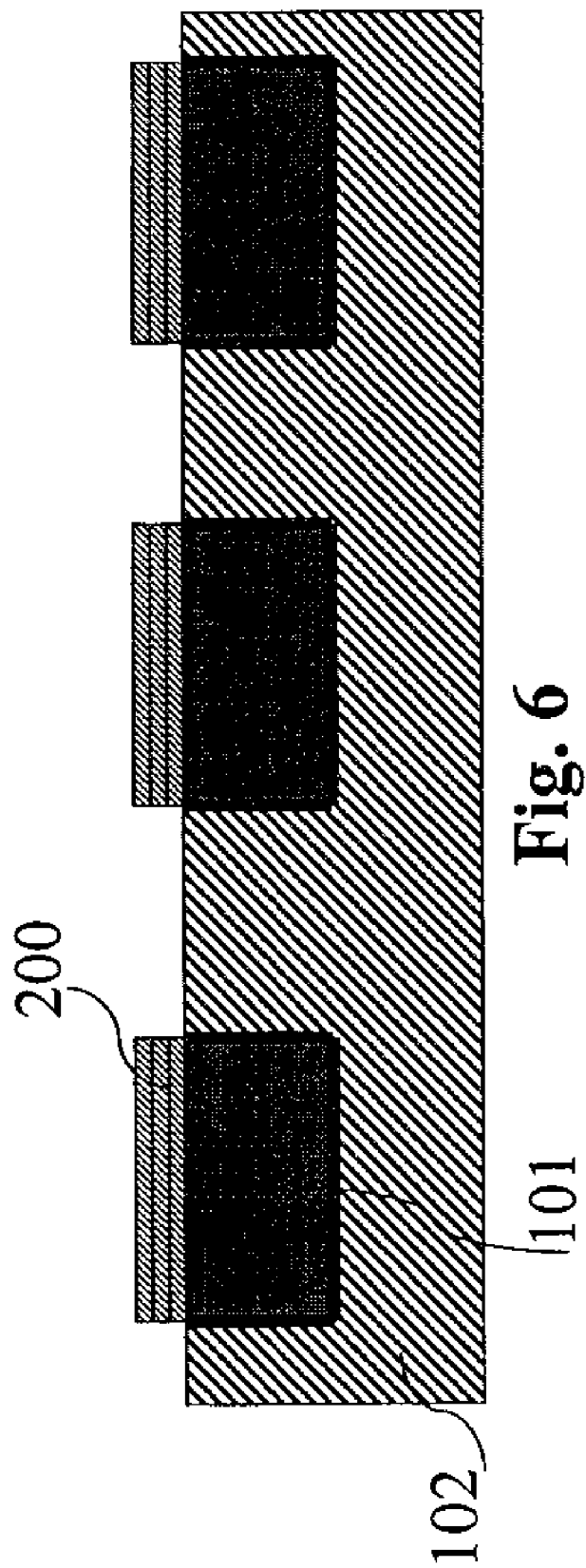

DUAL LINER CAPPING LAYER INTERCONNECT STRUCTURE

BACKGROUND OF THE INVENTION

The present invention relates to semiconductor integrated circuits (IC's), and more particularly to back-end-of-the-line (BEOL) interconnects structures.

The continuous scaling to smaller dimensions and the introduction of low-k dielectrics in copper interconnects have caused reliability issues to become a greater concern in addition to increasing process complexity. In semiconductor interconnect structures Electromigration (EM) has been identified as a metal failure mechanism. EM is a serious reliability concern for very large scale integrated (VLSI) circuits.

Electromigration failure along the Cu/dielectric interface has been identified as a major reliability concern for VLSI circuit applications. It has been observed that voiding in the metal line with the mass transport in the Cu line occurring along the interface of the dielectric, for example Si3N4, SiC, and SiC(N,H), capping layer and Cu. Reducing Cu transport and atomic voiding at the Cu/dielectric interface is a major objective in the semiconductor industry for reliability enhancement.

FIG. 1 is a cross sectional view of a conventional interconnect structure. A copper interconnect 10 is formed in an inter level dielectric (ILD) material 20. A compressive capping layer 30 is then formed over the exposed surface of the interconnect structures 10 and ILD 20. In the conventional interconnect structure shown in FIG. 1, a single compressive capping layer 30 is provided with a single CVD deposition step. The compressive capping layer is deposited with a typical thickness of approximately 250 Å. The compressive capping layer in this case results in a tensile stress within the Cu interconnect. The CVD deposition parameters are typically at a pressure of approximately 2.4 Torr, temperature of approximately 400° C., and HF power of approximately 1,170 Watts, LF power of approximately 130 Watts. The gas composition and flow rates are typically $SiH_4$ at approximately 250 standard cubic centimeters per minute (sccm), $N_2$ at approximately 19,000 sccm, and $NH_3$ at approximately 1,300 sccm.

Reducing Cu transport and atomic voiding at the Cu/dielectric interface is disclosed in the present invention by creating compressive stresses in the Cu interconnect. In contrast to a Cu interconnect in the prior art with tensile stress, a Cu interconnect with high compressive stress results in better resistance to electromigration effects. It is also disclosed in the present disclosure that depositing a tensile film on top of the Cu interconnect and/or depositing a compressive film around the Cu interconnect results in high compressive stress in the Cu interconnect, which is beneficial for improving EM resistance in the Cu interconnect.

Therefore, an object of the present invention is to provide a high tensile stress capping layer on top of the Cu interconnects in order to reduce Cu transport and atomic voiding at the Cu/dielectric interface. The high tensile dielectric film is formed by depositing multiple layers of a thin dielectric material, each layer being under approximately 50 angstroms in thickness. Each dielectric layer is plasma treated prior to depositing each succeeding dielectric layer such that the dielectric cap has an internal tensile stress.

BRIEF SUMMARY OF THE INVENTION

The present invention provides a semiconductor device comprising: a dielectric layer with conductive interconnects partially embedded therein; and a tensile capping layer in contact with the conductive interconnects. The present invention further comprises a compressive capping layer in contact with the dielectric layer. The semiconductor device may further comprise a diffusion barrier layer partially surrounding the conductive interconnects. The tensile capping layer is preferably comprised of sequentially deposited layers.

The tensile capping layer is preferably comprised of a material selected from the group consisting of silicon dioxide ($SiO_2$), silicon nitride ($Si_3N_4$), and compounds of silicon such as $SiC_xN_yH_z$, where x, y and z are variable percentages. The conductive interconnects are preferably comprised of a material selected from the group consisting of aluminum, copper, tungsten, silver, gold, aluminum-copper and nickel. The diffusion barrier layer is preferably comprised of a material selected from the group consisting of Ta, TaN, Ti, TiN, Ru, RuN, RuTa, RuTaN, W, and WN.

The present invention also provides a method for forming a semiconductor device, comprising the steps of: providing a dielectric layer with conductive interconnects partially embedded therein; depositing a tensile capping layer on the dielectric layer and conductive interconnects; performing a plasma treatment on the tensile capping layer; removing the portion of the tensile capping layer on the dielectric layer; depositing a compressive capping layer on the tensile capping layer and the dielectric layer; and removing the compressive capping layer from the tensile capping layer.

The tensile capping layer is preferably deposited by chemical vapor deposition at a pressure of approximately 7 Torr, a temperature of approximately 400° C., and a high frequency power of approximately 600 Watts and low frequency power of approximately 0 Watts. The chemical vapor deposition comprises a gas composition and flow rate of $SiH_4$ at approximately 150 sccm, $N_2$ at approximately 8,000 sccm, and $NH_3$ at approximately 2,500 sccm.

The tensile capping layer is preferably a dielectric material selected from the group consisting of silicon dioxide, silicon nitride and a compound of silicon, carbon, nitrogen and hydrogen in the form of $SiC_xN_yH_z$ where x, y and z are variable percentages.

The plasma treatment is preferably at a pressure of approximately 5 Torr, a temperature of approximately 400° C., and a high frequency power of approximately 500 Watts and low frequency power of approximately 0 Watts. The plasma treatment comprises a gas composition and flow rate of $N_2$ at approximately 8,000 sccm for approximately 40 seconds. The tensile capping layer and the plasma treatment are preferably performed in situ.

The compressive capping layer is preferably removed from the tensile capping layer by chemical mechanical polishing. The tensile capping layer is preferably a multiple deposition capping layer deposited on the dielectric layer and the conductive interconnects by a least two sequential deposition and plasma treatment steps.

The present invention also provides a method for forming a semiconductor device, comprising the steps of: providing a dielectric layer with conductive interconnects partially embedded therein; depositing a compressive capping layer on the dielectric layer and the conductive interconnects; removing the portion of the compressive capping layer on the conductive interconnects; depositing a tensile capping layer on the compressive capping layer and the conductive interconnects; and removing the tensile capping layer from the compressive capping layer.

The tensile capping layer is preferably deposited by chemical vapor deposition at a pressure of approximately 7 Torr, a temperature of approximately 400° C., and a high frequency power of approximately 600 Watts and low frequency power of approximately 0 Watts. The chemical vapor deposition comprises a gas composition and flow rate of $SiH_4$ at approximately 150 sccm, $N_2$ at approximately 8,000 sccm, and $NH_3$ at approximately 2,500 sccm.

The tensile capping layer is preferably a dielectric material selected from the group consisting of silicon dioxide, silicon nitride and a compound of silicon, carbon, nitrogen and hydrogen in the form of $SiC_xN_yH_z$ where x, y and z are variable percentages. The plasma treatment is preferably at a pressure of approximately 5 Torr, a temperature of approximately 400° C., and a high frequency power of approximately 500 Watts and low frequency power of approximately 0 Watts. The plasma treatment comprises a gas composition and flow rate of $N_2$ at approximately 8,000 sccm for approximately 40 seconds. The tensile capping layer and the plasma treatment are preferably performed in situ.

The compressive capping layer is preferably removed from the tensile capping layer by chemical mechanical polishing. The tensile capping layer is preferably a multiple deposition capping layer deposited on the dielectric layer and the conductive interconnects by a least two sequential deposition and plasma treatment steps.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 3 through 12 are schematic cross-sectional views illustrating preferred structures according to the present invention.

DETAILED DESCRIPTION OF THE INVENTION

The present invention is now described in greater detail by referring to the following discussion and drawings that accompany the present application. The drawings of the present application, which are referred to in greater detail herein below, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
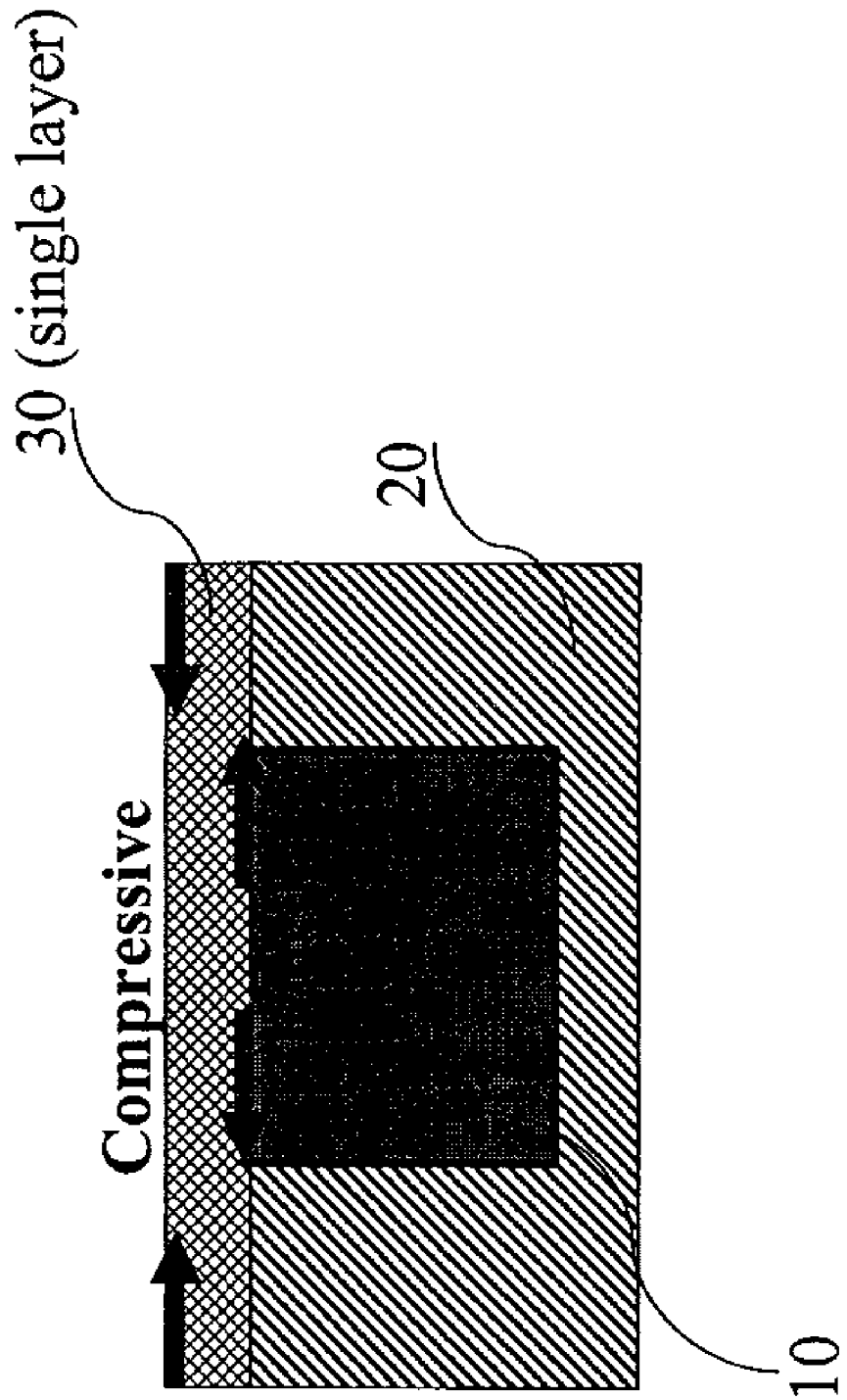
FIG. 1 is a schematic cross-sectional view illustrating a conventional interconnect structure.
Figure 2:
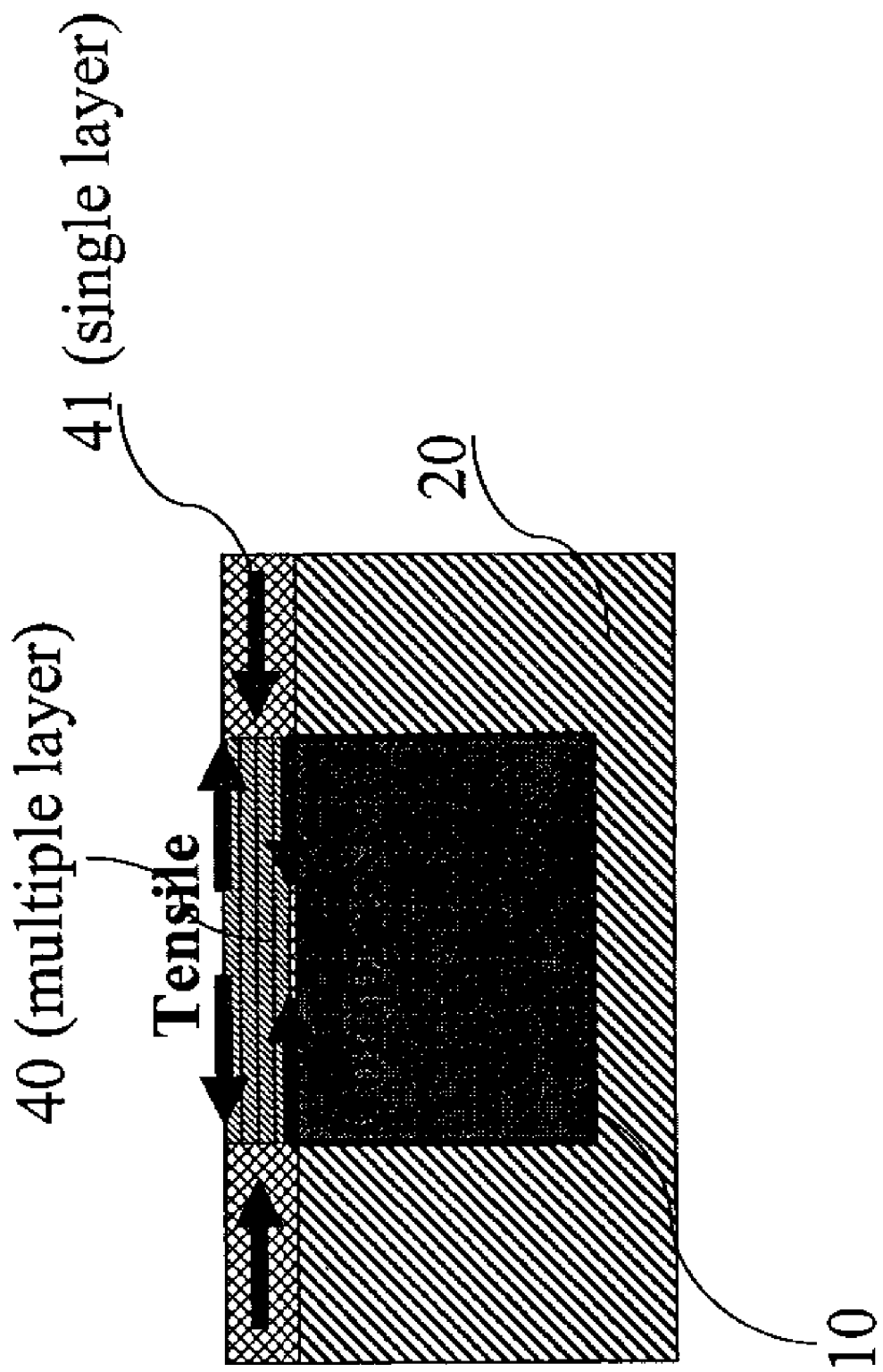
FIG. 2 is a schematic cross-sectional view illustrating a preferred embodiment of the present invention.

A preferred embodiment of the present invention is illustrated in FIG. 2. A multiple deposition tensile capping layer 40 is formed only on the copper interconnect 10. A single deposition compressive capping layer 41 is formed only on the ILD 20 surface. In the present invention specially tailored CVD deposition parameters and used in conjunction with a post deposition surface treatment in between capping layer depositions to provide a tensile stress capping layer on the interconnects. In a preferred embodiment a single deposition will deposit less than approximately 50 Å. In a preferred embodiment the multiple layer tensile capping layer 40 is comprised of at least 3 sequentially deposited and treated layers.

Figure 3:
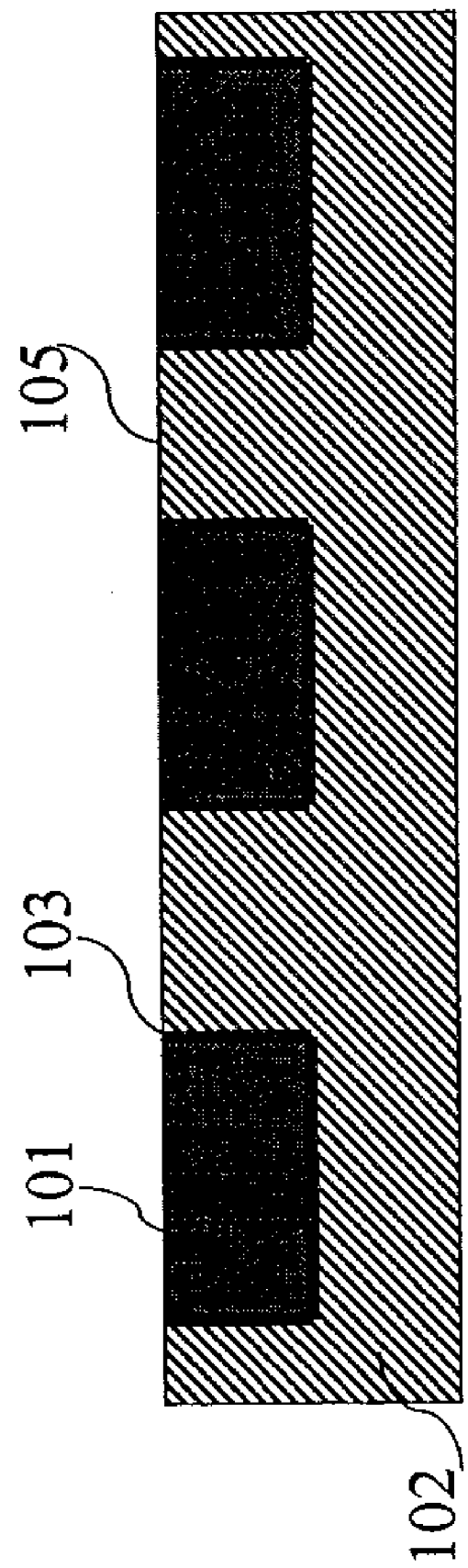

Referring to FIG. 3 a preferred embodiment of the present invention is described in more detail. FIG. 3 is a cross sectional view of a portion of a microelectronic element or chip in which a plurality of metal interconnects are provided by a conductive interconnect material 101 formed in patterned openings in accordance with an embodiment of the invention. FIG. 3 illustrates a stage in fabrication in which an interlevel dielectric layer or "ILD" 102 has been formed.

The ILD 102 material is preferably a low-k material such as SiCOH or SiLK. The ILD 102 material typically has a dielectric constant that is approximately 4.0 or less, with a dielectric constant of approximately 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0.

Within the ILD 102, a plurality of patterned openings are provided, typically in form of line patterns which extend horizontally in a direction of a major surface 105 which is defined by the upper surface of the dielectric layer 102, or which extend in a direction parallel to such surface. Within each patterned opening, a diffusion barrier material 103 is deposited to line the walls and bottom of each opening, after which a conductive interconnect material 101 is deposited to fill the remaining space within each opening. These steps are followed typically by a planarization process, such as a chemical mechanical polishing ("CMP") process, which removes any excess metal that contacts the exposed upper surface 105 of the ILD 102 outside of the patterned openings.

The conductive interconnect material 101 that fills each opening in the dielectric layer 102 is preferably a metal, for example, a noble metal, that is not prone to destructive corrosion and has good conductive properties. However, a few metals and alloys of metals stand out as being especially suited for forming conductive interconnect lines in the BEOL fabrication of integrated circuits or chips. Such metals include aluminum, copper, tungsten, silver, gold, aluminum-copper and nickel. In a particular embodiment, the conductive interconnect material 101 which fills the patterned opening in the dielectric layer 102 consists essentially of copper.

When the conductive interconnect material 101 includes copper or other metal prone to diffusing through dielectric materials, i.e., when the metal has a "high coefficient of diffusion", the conductive interconnect material 101 is preferably formed over a layer of metal or compound of a metal which functions as a diffusion barrier. The diffusion barrier material 103 prevents the copper from diffusing from the conductive interconnect material 101 into the ILD 102 adjacent to the walls and bottom of the metal line.

The diffusion barrier material 103 is preferably Ta, TaN, Ti, TiN, Ru, RuN, RuTa, RuTaN, W, WN or any other material that can serve as a barrier to prevent conductive material from diffusing there through. The diffusion barrier material 103 does not interact with the conductive interconnect material 101, such that the barrier layer 103 does not affect the conductive properties of the conductive interconnect material 101 or interact with the dielectric material of the ILD 102 to affect its dielectric properties. Deposition is formed by a deposition process such as, for example, atomic layer deposition (ALD), chemical vapor deposition (CVD), plasma enhanced chemical vapor deposition (PECVD), sputtering, chemical solution deposition, or plating.

The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combinations including multilayers thereof. When the substrate is a conducting material, the substrate may include, for example, polySi, an elemental metal, alloys of elemental metals, a metal silicide, a metal nitride or combinations including multilayers thereof. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a lower interconnect level of a multilayered interconnect structure.

Figure 4:
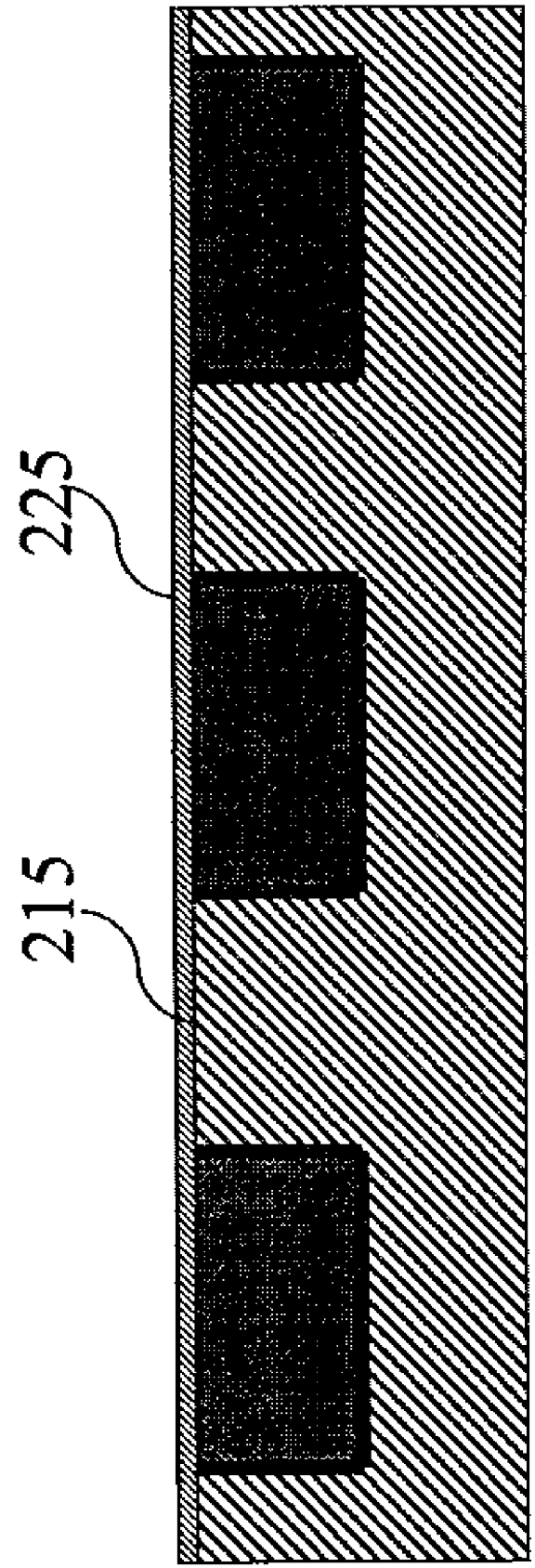

Referring now to FIG. 4 there is illustrated the deposition of a first dielectric capping layer 215. In a preferred embodiment the CVD deposition parameters are at a pressure of approximately 7 Torr, temperature of approximately 400° C., and HF power of approximately 600 Watts, LF power of approximately 0 Watts. The gas composition and flow rates are $SiH_4$ at approximately 150 sccm, $N_2$ at approximately 8,000 sccm, and $NH_3$ at approximately 2,500 sccm.

The first dielectric capping layer 215 can include any dielectric material or combination of dielectric materials which is capable of maintaining a stress relative to the metal filled line patterns. Preferably, the first dielectric capping layer 215 consists essentially of one or more dielectric materials or combinations of dielectric materials selected from the group consisting of silicon dioxide ($SiO_2$), silicon nitride ($Si_3N_4$), and or other dielectric compound of silicon such as $SiC_xN_yH_z$, where x, y and z are variable percentages.

After deposition, the first dielectric capping layer 215 is subjected to an extended time, high temperature and high frequency power plasma treatment, preferably using a combination of ammonia and nitrogen species ($NH_3$ and $N_2$) or, alternatively, hydrogen ($H_2$). In a preferred embodiment the plasma treatment parameters are at a pressure of approximately 5 Torr, temperature of approximately 400° C., and HF power of approximately 500 Watts, LF power of approximately 0 Watts. The gas composition and flow rates are $N_2$ at approximately 8,000 sccm. The plasma treatment is for approximately 40 seconds.

The dielectric cap deposition and subsequent plasma treatment are preferably performed in situ, i.e., in the same process chamber or in the same tool having one or more connected chambers. In that way, it is performed without having to manually remove the substrate from the chamber to deposit the dielectric cap after plasma treating the surface of the ILD. In a preferred embodiment, a first dielectric cap layer 215 is deposited to cover the exposed upper surface 105 of the ILD 102 and the conductive interconnect material 101 to a thickness of less than approximately 50 angstroms. After deposition, the exposed upper surface 225 of the first dielectric cap layer 215 is subjected to a second plasma treatment. The second plasma treatment has the effect of imparting a tensile stress to the first dielectric cap layer 215.

Referring now to FIG. 5(a) and FIG. 5(b), a second dielectric capping layer 226 is deposited to cover the exposed upper surface 225 of the first dielectric capping layer 215. Like the first dielectric capping layer 215, the second dielectric capping layer 226 preferably is formed to a thickness of less than about 50 angstroms. Like the first dielectric capping layer 215, the second dielectric capping layer 226 can include any dielectric material or combination of dielectric materials which is capable of maintaining a stress. Preferably, the second dielectric capping layer 226 consists essentially of one or more dielectric materials or combinations of materials selected from the group consisting of silicon dioxide, silicon nitride and a compound of silicon, carbon, nitrogen and hydrogen in the form of $SiC_xN_yH_z$, where x, y and z are variable percentages.

Preferably, the second dielectric capping layer 226 consists essentially of the same dielectric material as the first dielectric cap layer. Like the first dielectric capping layer 215, the exposed upper surface 230 of the second dielectric capping layer 226 also undergoes plasma treatment after deposition to control the tensile stress of the deposited second dielectric capping layer 226, preferably using the same parameters and species that are used during the plasma treatment of the first dielectric capping layer 215. For example, the plasma treatment can include a mixture of ammonia and nitrogen, or alternatively, hydrogen as the reactive species. As in the case of the first dielectric capping layer 215, these deposition and plasma treatment processes are preferably performed in situ.

Further regarding FIG. 5(a) and FIG. 5(b), following deposition and plasma treatment of the second dielectric capping layer 226, a third dielectric capping layer 236 is deposited to cover the exposed upper surface 230 of the second dielectric capping layer 226. Like the first dielectric capping layer 215 and second dielectric capping layer 226, the third dielectric capping layer 236 is formed to a thickness of less than about 50 angstroms. Like the first and second dielectric capping layers 215, 226, the third dielectric capping layer 236 can include any dielectric material or combination of dielectric materials which is capable of maintaining a stress. Preferably, the third dielectric capping layer 236 consists essentially of one or more dielectric materials or combinations of dielectric materials selected from the group consisting of silicon dioxide, silicon nitride and a compound of silicon, carbon, nitrogen and hydrogen in the form of $SiC_xN_yH_z$.

Preferably, the third dielectric capping layer 236 consists essentially of the same dielectric material as the first and second dielectric capping layers. As in the plasma treatments performed to the first and second dielectric capping layers, the exposed upper surface 240 of the third dielectric capping layer 236 also undergoes plasma treatment after deposition to control or produce a tensile stress in the third dielectric capping layer 236, preferably using the same parameters and species that are used during the plasma treatment of the first and second dielectric capping layers. For example, the plasma treatment can include a mixture of ammonia and nitrogen, or alternatively, hydrogen as the reactive species. As in the case of the first and second dielectric capping layers, these deposition and plasma treatment processes are preferably performed in situ.

The purpose of successively depositing the dielectric capping layers and the plasma treatments is to achieve a tensile dielectric capping layer 200 which has an internal tensile stress. The internally tensile stressed dielectric capping layer 200 will exert a compressive stress at the surface of the conductive interconnect material 101 which it contacts. As a result, the conductive interconnect material 101, e.g., copper, is less likely to exert a tensile stress on the metal features it contacts, which could then result in the problems described above.

The number of dielectric capping layers that are used and other parameters associated with their fabrication are not of primary importance. Rather, the magnitude and stability of the internal tensile stress of the dielectric capping layer are of greater importance. Therefore, if a single layer of the dielectric capping material is deposited to have the required internal tensile stress of the desired magnitude and properties, then a single such dielectric capping layer suffices. Alternatively, if more than three such dielectric capping layers are needed to achieve these properties, then more than three such dielectric capping layers need to be deposited and plasma treated in accordance with the method described above. In the preferred embodiment illustrated in FIG. 5(a) and FIG. 5(b), the tensile layer 200 is comprised of three sequentially deposited layers and accompanying plasma treatments.

Referring now to FIG. 6 there is illustrated the removal of the portion of the tensile capping layer 200 on the ILD 102 surface by conventional lithography and etching processes. The lithographic process includes applying a photoresist, exposing the photoresist to a desired pattern of radiation, and developing the exposed resist utilizing a conventional resist developer. The etching step may comprise a dry etching process, a wet chemical etching process or a combination thereof. The term "dry etching" is used herein to denote an etching technique such as reactive-ion etching, ion beam etching, plasma etching or laser ablation.

Figure 7:
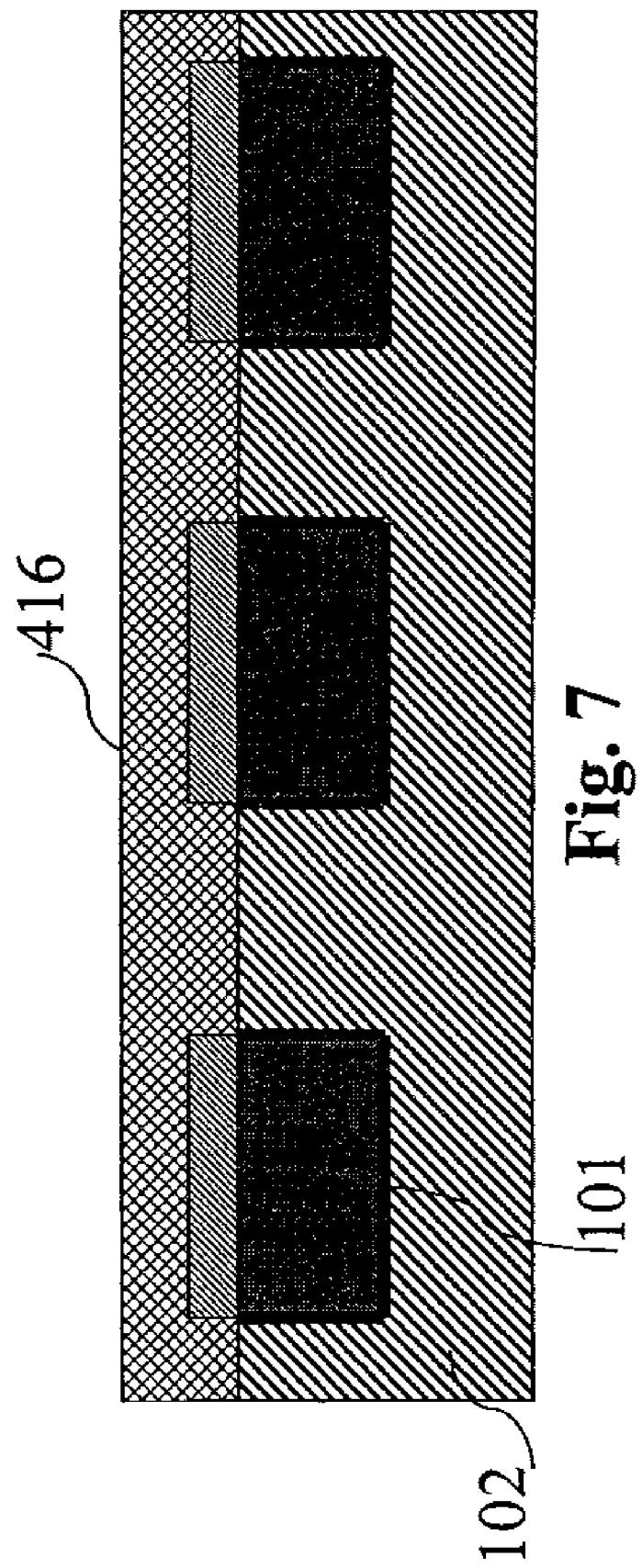

Referring now to FIG. 7 there is illustrated the deposition of a single compressive dielectric layer 416 by conventional processes. The blanket deposition will deposit the compressive dielectric layer 416 over the tensile dielectric capping layer 200 and re-exposed upper surface 105 of the ILD 102.

Figure 8:
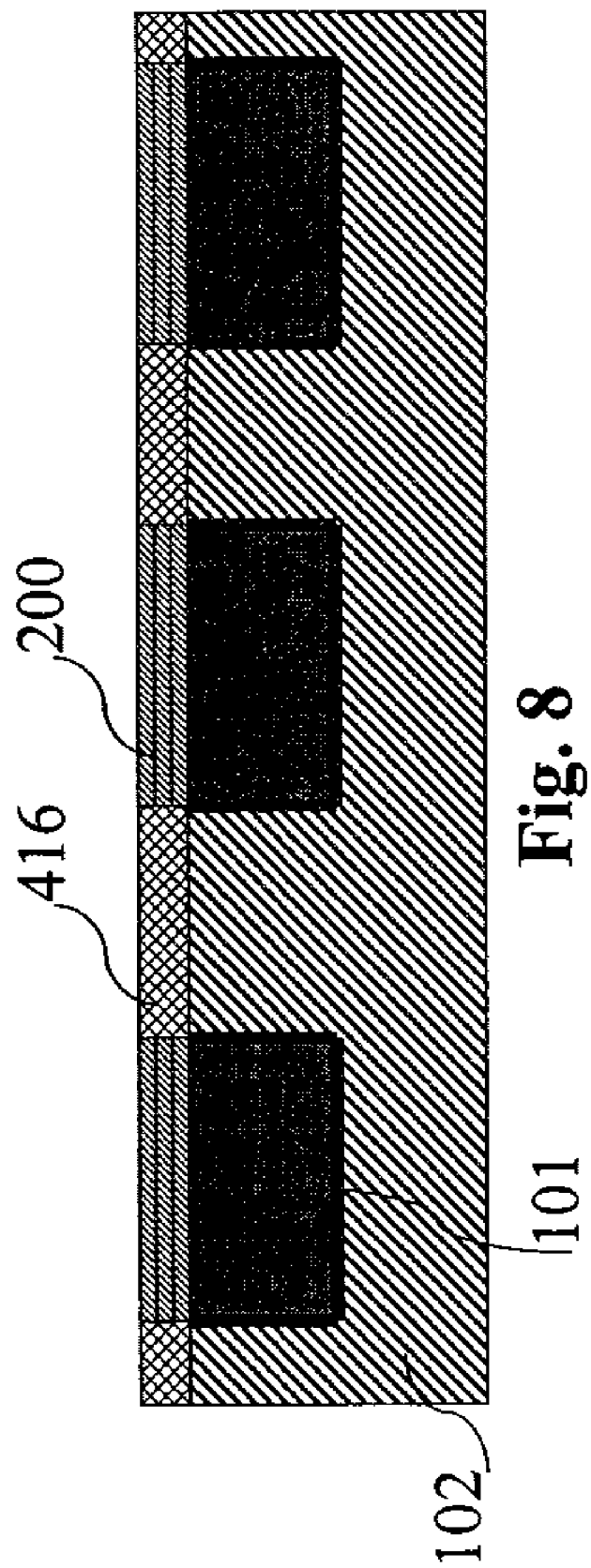

Referring now to FIG. 8 the structure is illustrated after CMP. Removing the compressive layer material deposited on the tensile layer 200 results in a multiple deposition tensile capping layer 200 formed only on the conductive interconnect material 101. A single deposition compressive dielectric layer 416 is formed only on the ILD 102 surface. In this preferred embodiment the multiple deposition tensile capping layer 200 is comprised of three sequentially deposited and treated layers.

Figure 9:
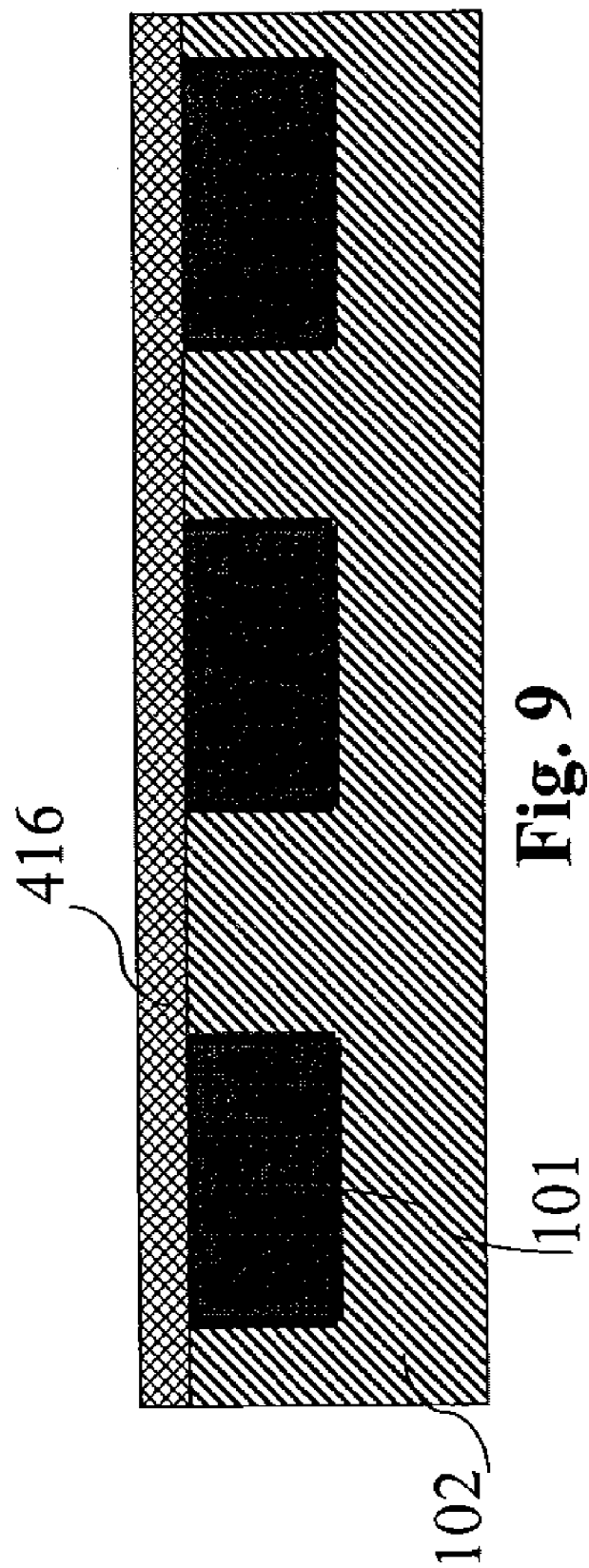

Referring now to FIG. 9 there is illustrated another embodiment of the present invention. As described above a conductive interconnect material 101 is formed in an inter level dielectric (ILD) material 102. There will typically also be a diffusion barrier material 103 between the conductive interconnect material 101 and ILD 102. There is now deposited a single compressive dielectric layer 416.

Figure 10:
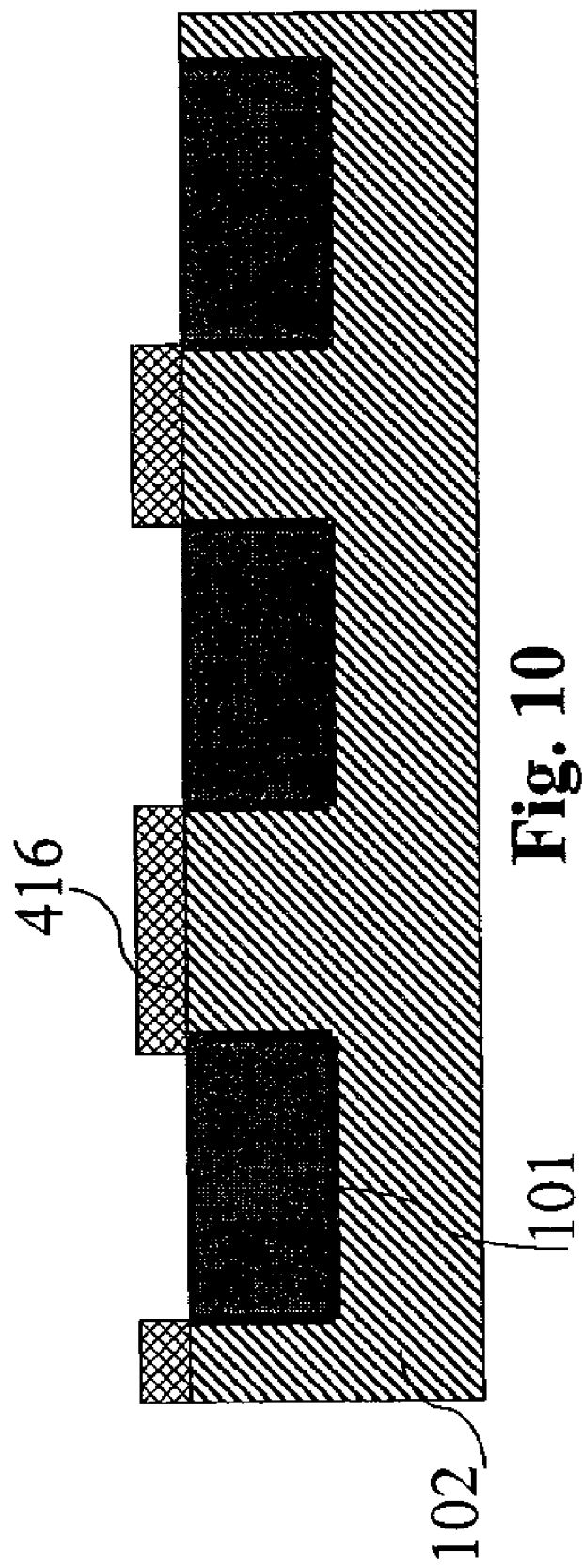

Referring now to FIG. 10 there is illustrated the removal of the portion of the single compressive dielectric layer 416 on the conductive interconnect material 101 surface by conventional lithography and etching processes.

Figure 11:
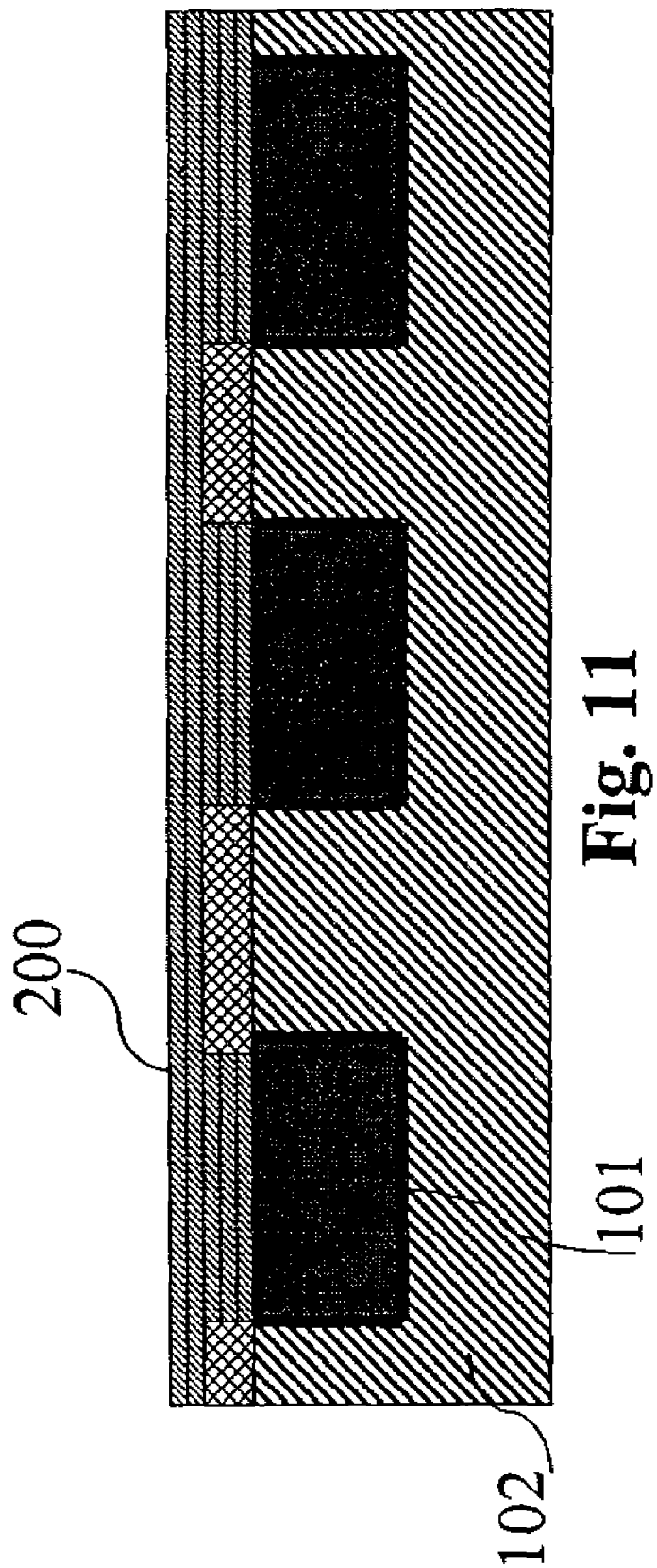

Referring now to FIG. 11 there is illustrated the deposition of a tensile dielectric capping layer 200. The blanket deposition will deposit the tensile dielectric layer 200 over the compressive dielectric layer 416 and the conductive interconnect material 101. In this preferred embodiment the tensile layer 200 is comprised of multiple sequentially deposited layers and accompanying plasma treatments as described in the prior embodiment and illustrated in FIGS. 4 and 5.

Figure 12:
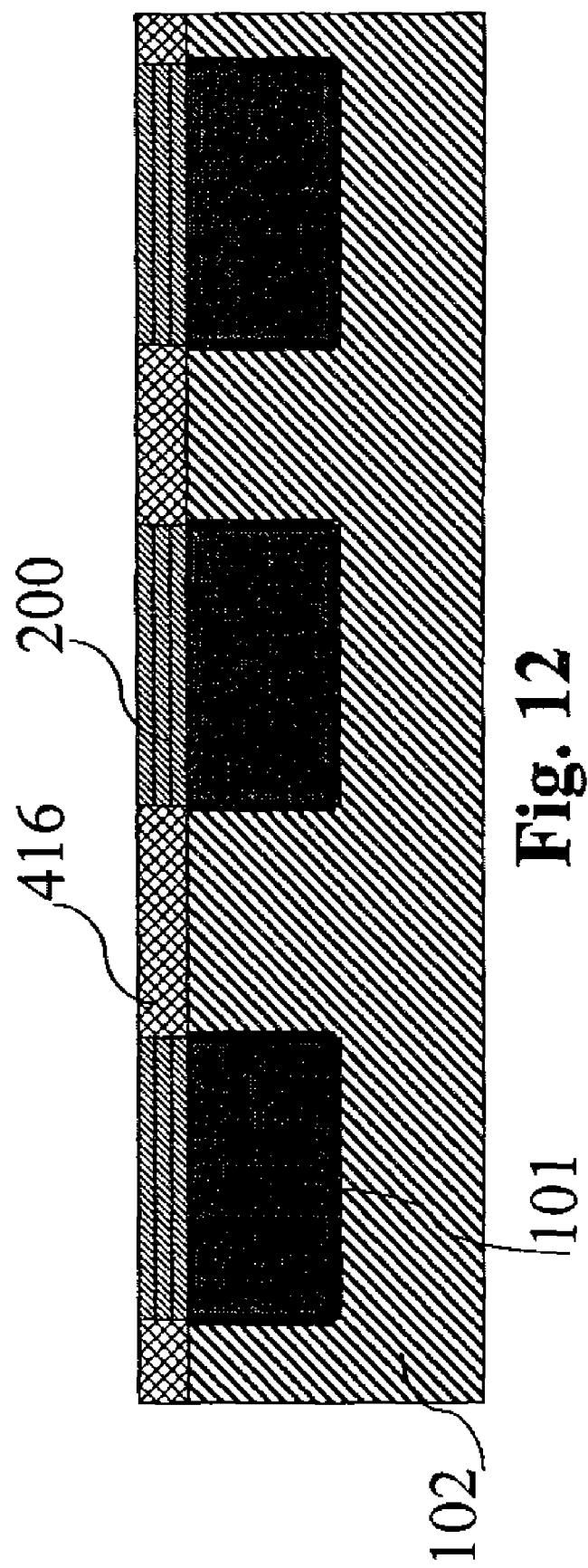

Referring now to FIG. 12 the structure is illustrated after CMP. Removing the tensile layer material deposited on the compressive layer 416 results in a multiple deposition tensile capping layer 200 formed only on the conductive interconnect material 101. A single deposition compressive dielectric layer 416 is formed only on the ILD 102 surface.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for forming a semiconductor device, comprising the steps of:
   providing a dielectric layer with at least one conductive interconnect partially embedded therein;
   depositing a compressive capping layer on said dielectric layer and said at least one conductive interconnect;
   removing the portion of said compressive capping layer on said at least one conductive interconnect;
   depositing a tensile capping layer on said compressive capping layer and said at least one conductive interconnect; and
   removing said tensile capping layer from said compressive capping layer.

2. The method of claim 1 wherein said tensile capping layer is deposited by chemical vapor deposition at a pressure of approximately 7 Torr, a temperature of approximately 400° C., and a high frequency power of approximately 600 Watts and low frequency power of approximately 0 Watts.

3. The method of claim 2 wherein said chemical vapor deposition comprises a gas composition and flow rate of $SiH_4$ at approximately 150 sccm, $N_2$ at approximately 8,000 sccm, and $NH_3$ at approximately 2,500 sccm.

4. The method of claim 1 wherein said tensile capping layer is a dielectric material selected from the group consisting of silicon dioxide, silicon nitride and a compound of silicon, carbon, nitrogen and hydrogen in the form of $SiC_xN_yH_z$ where x, y and z are variable percentages.

5. The method of claim 1 wherein said tensile capping layer is a multiple deposition capping layer deposited on said dielectric layer and said at least one conductive interconnect by a least two sequential deposition and plasma treatment steps.

* * * * *